United States Patent
Iannone et al.

(10) Patent No.: US 7,054,772 B2
(45) Date of Patent: May 30, 2006

(54) APPARATUS AND METHOD FOR MONITORING AND COMPENSATING FOR VARIATION IN SOLENOID RESISTANCE DURING USE

(75) Inventors: Charles A. Iannone, W. Henrietta, NY (US); Kenneth W. Turner, Mendon, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/677,646

(22) Filed: Sep. 30, 2003

(65) Prior Publication Data

US 2005/0071098 A1    Mar. 31, 2005

(51) Int. Cl.
G01R 25/00    (2006.01)
G01R 27/00    (2006.01)
G01R 13/00    (2006.01)

(52) U.S. Cl. .................................................. 702/65
(58) Field of Classification Search .................. 702/57, 702/60, 64, 65, 107, 108, 117, 118; 222/146.1, 222/146.5; 123/299, 490
See application file for complete search history.

(56) References Cited

U.S. PATENT DOCUMENTS 6,148,800 A * 11/2000 Cari et al. .................. 123/490
6,264,112 B1 * 7/2001 Landschoot et al. ........... 239/5
6,318,599 B1 * 11/2001 Estelle et al. ............ 222/146.5

* cited by examiner

*Primary Examiner*—Michael Nghiem
(74) *Attorney, Agent, or Firm*—Patrick M. Griffin

(57) ABSTRACT

A very small fixed current is passed through the coil of a solenoid during use thereof when the solenoid is in its "off" state of cyclic PWM command, the fixed current being less than the current required to actuate the solenoid to the "on" position. While the current is flowing through the coil, the voltage across the coil is measured. The resistance of the coil is calculated according to Ohm's Law. When the actual resistance is known, the duty cycle imposed on the solenoid may be altered to compensate for the resistance deviation from nominal. This allows, for example, fuel injectors for internal combustion engines to deliver the correct amount of fuel under all operating conditions.

7 Claims, 2 Drawing Sheets

APPARATUS AND METHOD FOR MONITORING AND COMPENSATING FOR VARIATION IN SOLENOID RESISTANCE DURING USE

INCORPORATION BY REFERENCE

Applicant incorporates by reference U.S. Pat. No. 6,264,112 (B1) Engine Fuel Injector, issued to Landschoot, et al., in that a solenoid actuated fuel injector for injecting fuel into an internal combustion engine need not be fully described in detail herein.

TECHNICAL FIELD

The present invention relates to solenoid actuators; more particularly, to means for detecting changes in resistance of solenoid windings; and most particularly, to apparatus and method for continuously determining the resistance of a solenoid winding during use and for correcting for changes in such resistance.

BACKGROUND OF THE INVENTION

Solenoid actuators are well known. In a typical solenoid actuator, an electromagnet includes a wound wire coil surrounding primary and secondary pole pieces. When a current is passed through the windings, an axial magnetic field is generated. A ferromagnetic armature movably disposed in the axial field is urged axially of the windings. The strength of the field, and thus of the actuator, is dependent upon the current at any given voltage. As is well known in the art, the current is inversely proportional to the resistance of the windings. Resistance of the coil can vary with the temperature of the coil. Resistance of the coil can also diminish progressively with length of use.

It is known to use solenoids to actuate fuel injectors for, among others, internal combustion engines and hydrocarbon reformers. Such a fuel injector typically is controlled in known fashion by pulse width modulation (PWM) control of the solenoid actuator; that is, the injector is fully open for a desired fraction of the time of a full injection cycle. Because the resistance and thus the action of a solenoid varies with temperature, it is further known to apply a correction factor to the PWM control, based on coil temperature. For example, if the nominal resistance of a coil is 12 ohms ($\Omega$), but due to ambient temperature and run time the coil resistance is actually 10.5 $\Omega$, then fuel flow through the injector would be greater than desired. At the lesser resistance, current flow is increased and this in turn decreases the opening time and increases the closing time of the fuel injector, effectively increasing total flow in each cycle. Such errors in flow are of special concern for fuel injector operation in open loop during cold engine starts since accurate fuel dispensing is essential to reducing cold-start engine exhaust emissions.

Currently, some known engine management systems (EMS) predict or infer coil temperature from other operating parameters, such as coil duty cycle, voltage, ambient temperature, operation time, and engine temperature, and then alter the pulse bandwidth to compensate for inferred resistance variation from nominal. These approaches share a common shortcoming in relying on inference and not measuring the actual resistance of a solenoid's coil.

What is needed is a means for measuring directly the resistance of a solenoid coil during use thereof, and for adjusting the energizing of the solenoid to compensate for coil resistance deviations from nominal.

It is a principal object of the present invention to provide improved control of a duty cycle of a solenoid.

It is a further object of the invention to improve fuel efficiency of an internal combustion engine.

It is a still further object of the invention to reduce unburned hydrocarbon emissions in engine exhaust.

SUMMARY OF THE INVENTION

Briefly described, a very small fixed current is passed through the windings of a solenoid during use thereof when the solenoid is in its "off" state of PWM command. The fixed current is lower than the current required to actuate the solenoid to the "on" position. While the small fixed current is flowing through the solenoid, the voltage across the coil is measured. Based on Ohm's law, the resistance of the coil is equal to the measured voltage divided by the fixed current ($R=V/I$). Because the current is being controlled and is constant, the actual resistance is directly proportional to the voltage measured. When the actual resistance is known, the duty cycle imposed on the solenoid may be altered to compensate for the resistance deviation from nominal. This allows, for example, fuel injectors for internal combustion engines to deliver the correct amount of fuel under all operating conditions, including variations in temperature and changing conditions due to length of use.

BRIEF DESCRIPTION OF THE DRAWINGS

The present invention will now be described, by way of example, with reference to the accompanying drawings, in which.

DESCRIPTION OF THE PREFERRED EMBODIMENTS

Figure 1:
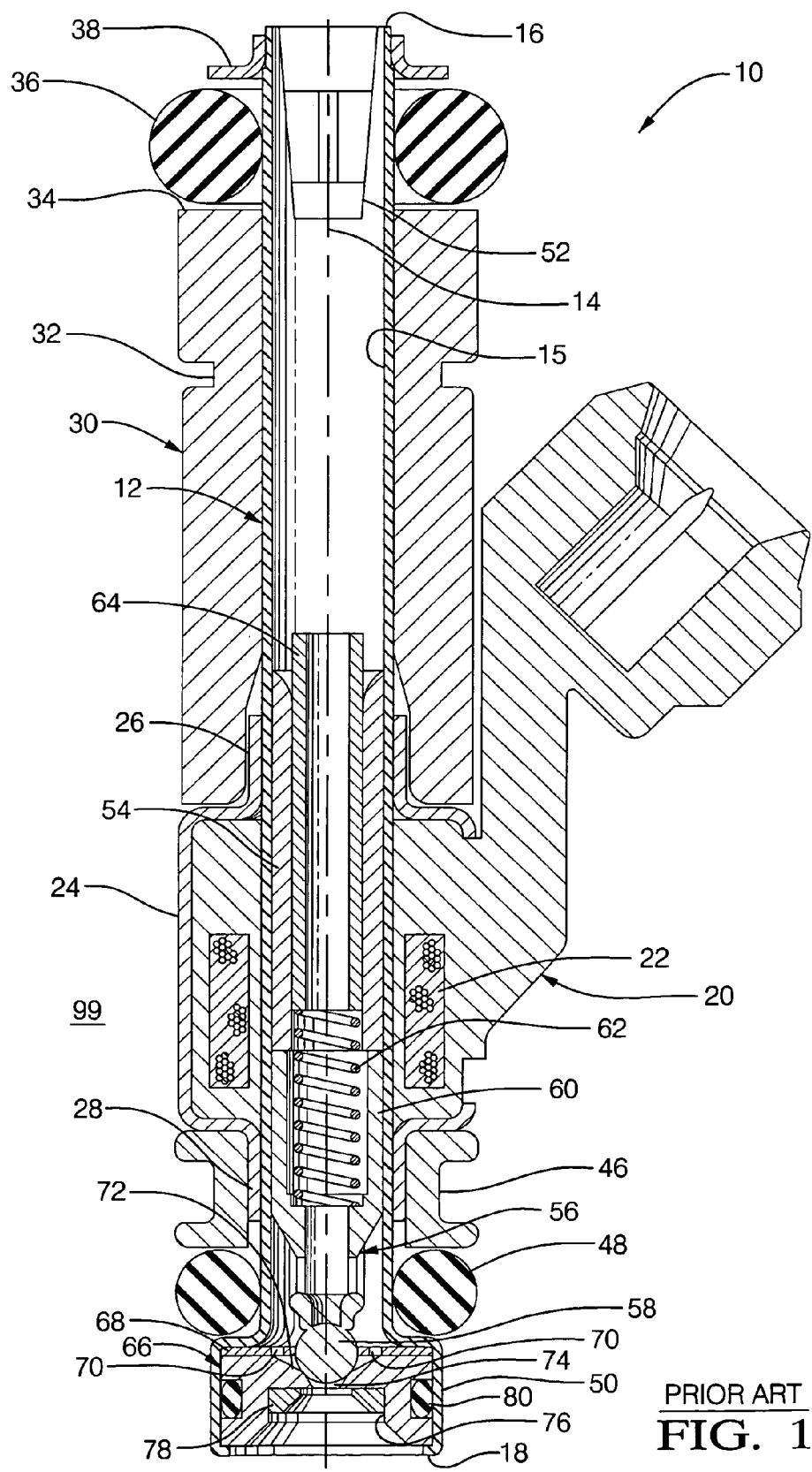
FIG. 1 is an elevational cross-sectional view of a prior art solenoid-actuated fuel injector.

Referring first to FIG. 1 of the drawings in detail, numeral 10 generally indicates a representative solenoid actuated fuel injector, the performance of which can benefit from control circuitry in accordance with the invention. Injector 10 is substantially as disclosed in U.S. Pat. No. 6,264,112, the relevant disclosure of which is incorporated herein by reference.

Injector 10 includes a continuous endoskeletal injector tube 12 which is centered on a central axis 14 and encloses a continuous passage 15 through the injector from an inlet end 16 of the tube to an outlet end 18. Preferably, the tube 12 has no openings except at the inlet and outlet ends and defines a continuous imperforate passage in which fuel is conducted and kept separate from all the components of the injector that are mounted externally of the tube. These include a separately formed coil assembly including a solenoid coil 22 extending around and closely adjacent to the tube but isolated thereby from the fuel in the tube. A magnetic coil body 24 surrounds the coil 22 and has upper and lower ends 26, 28 fixed to the outer surface of the tube.

A support element 30 is formed as a tubular member that slides over the tube and engages the body 24 surrounding an upper portion thereof. The support element includes a slot 32 for receiving a retainer clip, not shown, that holds the injector inlet end within a cup, not shown, of an associated fuel rail. The support element also provides a backup surface 34 at one end for constraining a seal ring 36 of the conventional O-ring type. A push-on seal retainer 38 is frictionally or otherwise retained on the inlet end 16 of the injector tube 12 to form with the other parts an annular groove in which the seal ring 36 is retained. A split spacer ring 46 extends around the lower end of the body 24 and engages an annular O-ring seal 48 which is retained, in part, by an expanded diameter portion 50 at the lower end of the injector tube 12.

Within the injector tube 12, an inlet fuel filter 52 is provided at the inlet end of the tube. A tubular magnetic pole is fixed within the tube in engagement with its interior surface. The pole extends from adjacent the upper end 26 of the body 24 to a position within the axial extent of the coil 22. An injection valve 56 is reciprocable within the tube 12 and includes a ball end 58 connected with a hollow armature 60 that slides within the tube. A biasing spring 62 engages the armature and an adjusting sleeve 64 fixed within the magnetic pole 54 to urge the injection valve downward toward a closed position.

Within the expanded diameter portion 50 of the tube 12, a valve seat 66 and a lower valve guide 68 are retained by crimped over portions of the tube outlet end 18.

The lower valve guide 68 is a disc positioned between the valve seat and a flange-like surface formed by the expanded diameter tube portion 50 to guide the ball end 58 of the injection valve. Lower valve guide 68 includes openings 70 to allow fuel flow through the guide 68 to a conical surface 72 of the valve seat against which the ball end 58 seats in the valve closed position. A central discharge opening 74 of the valve seat 66 connects the conical surface 72 with a circular recess 76 in which a multi-hole spray director 78 is press fitted or otherwise retained. An outer seal ring 80 is captured in a groove of the valve seat and prevents fuel from leaking around the valve seat and bypassing the discharge opening 74.

In operation, energizing of the coil 22 draws the armature 60 upward into engagement with the end of the magnetic pole 54, moving the ball end 58 of valve 56 upward away from the conical surface 72 of the valve seat 66. Fuel is then allowed to flow through the tube 12 and valve seat 66 and out through the director 78 directly or indirectly into an associated combustion chamber of an associated internal combustion engine 99. Upon de-energization of the coil 22, the magnetic field collapses and spring 62 seats the valve 56 on conical surface 72, cutting off further fuel injection flow.

Figure 2:
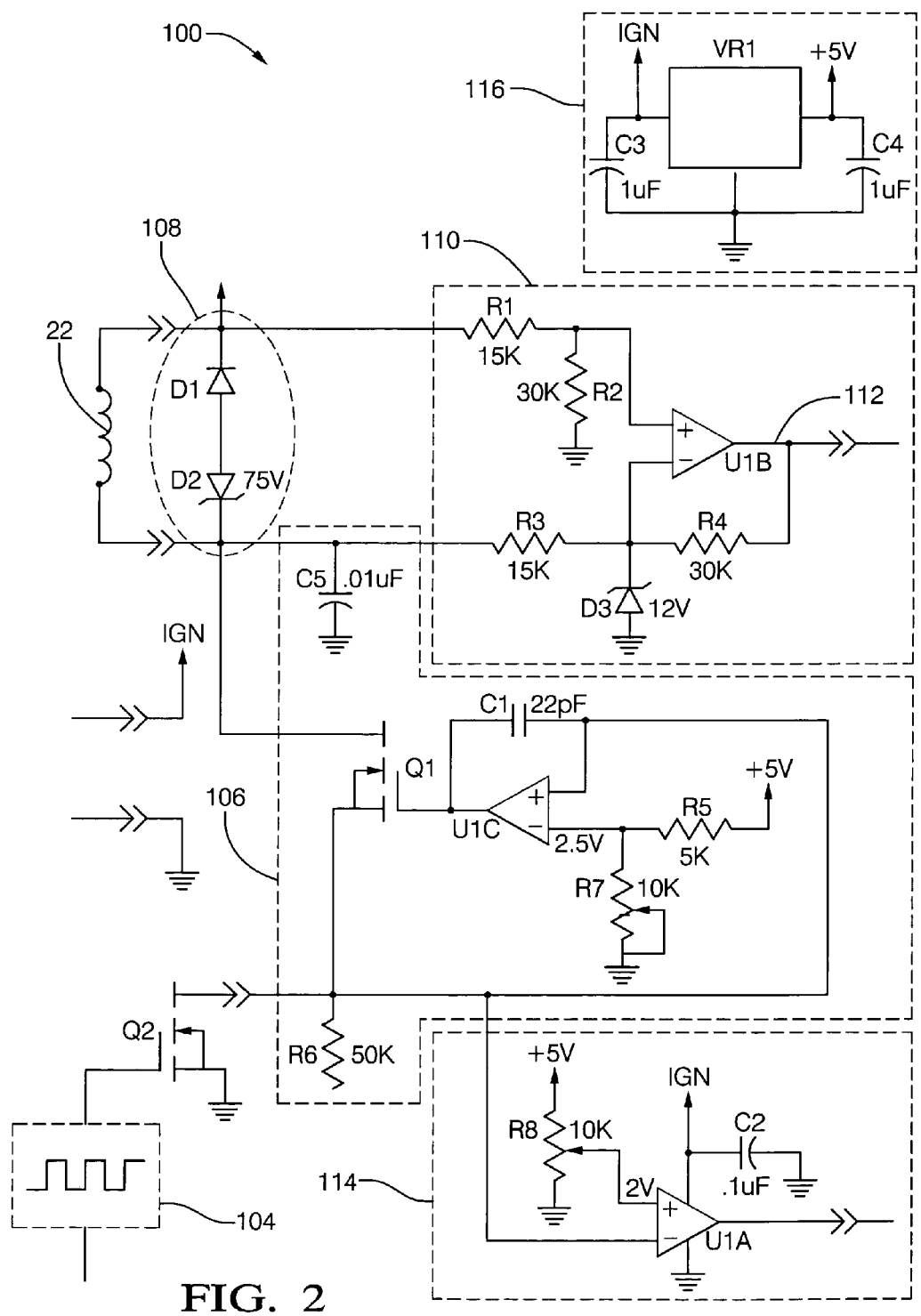
FIG. 2 is a schematic diagram of an electronic control circuit for determining the actual resistance of a solenoid coil during a duty cycle thereof.

Referring to FIG. 2, an injector resistance measurement circuit 100 in accordance with the invention is applicable to measurement of electrical resistance in solenoid coils generally and, for example, coil 22 in fuel injector 10 during operation thereof. Circuit 100 outputs a voltage value 112 corresponding to the resistance of coil 22 by controlling the current through the injector coil and measuring the voltage across the injector coil while the injector is normally commanded "off". Controlling the current through the injector makes the denominator of the resistance calculation R=V/I a "constant value". Thus, with a constant current, the resistance of the injector is directly proportional to the voltage measured across it. Note that the current imposed for resistance measurement during the coil "off" state, for example, about 50 mA, must be much less than the current required for energizing the solenoid to the "on" state, such that the solenoid armature does not move during resistance measurement.

The injector is turned on and off by an injector driver Q2. The injector driver may be external to the current measurement circuit. The design of circuit 100 allows the circuit to be applied to existing injector driver systems.

The injector is "on" when the injector logic signal 104 is high, and the injector is "off" when the injector logic signal is low. Injector driver Q2 acts as a switch to complete the circuit to apply the full power available to the injector. Current through the injector is controlled by section 106 of the circuit that consists of the following components: operational amplifier U1C, resistors R5, R6, R7, capacitors C1, C5, and Q1. Preferably, Q1 and Q2 are logic level driven power Field Effect Transistors (FETs). R6 acts as a "current sense" resistor with a value of about 50 ohms. The voltage measured across R6 is directly proportional to the current through it, and is the feedback signal to the current control circuit. R6 is part of a series circuit that includes the injector, Q1, and R6, so the current through R6 is the same as the current through the injector (the current through each component in a series circuit is the same). Q1 acts as a current control device to the series circuit (Injector, Q1, and R6). Q1 is controlled by operational amplifier U1C. U1C is configured to control the current through R6 such that the voltage across R6 results in a voltage at the negative input of U1C equal to the voltage at the positive input of U1C. The output of U1C will change in order to keep the voltages at the two inputs of U1C the same. The voltage at the positive input of U1C is set to a constant value of about 2.5V with a voltage divider circuit made by R5 and R7. R7 is adjustable for precise setting of the current control circuit. R5 and R7 divide the voltage provided from a regulated 5V supply (which is described later) to keep it at a constant level as the injector supply voltage varies.

If the voltage across R6 is controlled to a constant 2.5 volts, then the current through R6 is being controlled to a constant 50 mA.

C1 is in the current control schematic to keep high frequency noise on the inputs from affecting the output. (C1 is not critical to the circuit operation.) C5 acts as a decoupling capacitor for the voltage at the low side of the injector, which helps keep the voltage from "ringing" or oscillating as the current through the injector is effectively being controlled. When injector driver Q2 is turned on to complete the injector drive circuit, R6 is effectively shorted out, forcing the voltage across R6 to be near zero. When this happens, the output of U1C turns fully on to try to compensate for the low reading on its negative input. This turns Q1 on fully which completes the injector driver circuit to turn the injector on as intended.

A "snubber circuit" 108 comprising diodes D1 and D2 is necessary to provide a method to quickly dissipate the stored energy in injector coil 22 when injector driver 102 is turned off. When the injector driver circuit is "opened" by turning off driver 102, the injector coil 22 becomes a current source. The current sourced from the injector causes the voltage at the drain of Q1 to become potentially very large. Zener Diode D2 conducts reverse current when the voltage at its cathode reaches the zener voltage relative to its anode. When this current flows, snubber circuit 108 is considered "active". The voltage at the drain of Q1 is thus limited to the sum of the zener voltage of D2, the forward voltage drop of D1, and the supply voltage "IGN", which may be, for example, 75V+0.65V+13.5V, or 89.15 Volts. This high voltage allows a fast dissipation of the energy stored in the injector, which allows it to turn off very quickly.

In injector voltage measurement circuit 110, operational amplifier U1B is configured as a differential amplifier (along with resistors R1, R2, R3, and R4) to measure the voltage across the injector coil 22. Resistors R1, R2, R3, and R4 are selected to provide a fixed gain of around 2 to the amplifier circuit. Preferably, R3 has a power rating above 0.125 watt, to dissipate more power when the snubber circuit is active. The output of U1B is about two times the voltage across the injector coil. The output of U1B cannot exceed the supply voltage, so when the injector is "on", the output is nearly the same as the supply voltage. Zener diode D3 serves to protect the negative input of U1B during the time when the injector turns off, and snubber circuit 108 is active. Zener diode D3 limits the voltage to the zener voltage of the diode during the transient.

The injector voltage output 112 from U1B is two times the voltage across the injector coil while the current through the injector is 50 mA. The output value at this output in volts is thus effectively one tenth of the resistance value R of injector coil 22 in ohms.

An enable measurement circuit 114 is used to prevent readings when the injector coil is "on", or in an energized state. Circuit 114 comprises operational amplifier U1A configured as a comparator, with potentiometer resistor R8 used to set the voltage being compared to. The output of U1A is high only when the voltage across R6 is higher than the voltage at the negative input of U1A, which is set by the voltage divider circuit of potentiometer resistor R8. The voltage across R6 is low when the injector coil is "on", and thus, the enable measurement circuit 114 output is low. The voltage across R6 is higher than the voltage at the negative input of U1A when the injector coil is "off", or in a de-energized state, and thus, the enable measurement circuit 114 output is high.

C2 is a decoupling capacitor for the supply voltage to the operational amplifier U1A. Preferably, U1A, U1B, and U1C are components of a single quad package high-speed precision operational amplifier integrated circuit.

Note that the injector voltage output signal 112 from U1B is not necessarily representative of the injector resistance when the enable measurement signal is high. Further processing of the "injector voltage" and "enable measurement" signals is needed to prevent reading the injector resistance while the injector's stored energy is being dissipated. The injector voltage output reading 112 at the output of U1B can safely be considered representative of the injector resistance about 2 milliseconds after the enable measurement signal goes high.

A voltage regulator section 116 is needed to provide a constant voltage source to be used for reference voltages in the current control, and the enable measurement portions of the circuit. Voltage regulator VR1, along with capacitors C3 and C4, make up the voltage regulator circuit. The input is the injector supply voltage "IGN", and the output is 5 Volts (as long as the injector supply voltage is in its normal operating range of between 8 and 16 Volts).

Referring still to the example of a solenoid coil in a fuel injector, pulse-width controlled operation of injector 10 and control circuit 100 is controlled by a convention programmable controller or a computer (not shown) which may be an Engine Control Module (ECM) for an internal combustion engine 99 (FIG. 1). The computer is provided with a desired fuel flow aim and is programmed with a conventional look-up table of base pulse width vs. coil resistance, preferably expressed as negative and positive pulse width trim factors. Such a table is readily determined in known fashion without undue experimentation.

In operation, the computer monitors voltage 112, and thus coil resistance, during "off" portions of the injector cycle. A base pulse width, i.e. injector logic signal 104, for the fuel injector is calculated, based on a nominal coil resistance and plurality of computer input parameters, for example, engine air flow, the injector gain rate, system voltage, and manifold absolute pressure. As coil resistance changes, the computer refers to the table to shorten or lengthen the pulse width 104 to maintain the desired actual flow from the fuel injector. In the example discussed above, wherein the actual resistance is 10.5 Ω rather than the nominal resistance of 12 Ω, the value in the look-up table would be negative, reducing the pulse width 104 of the device to compensate for the higher anticipated flow. Conversely, the look-up value would be positive if the coil resistance becomes higher than the nominal 12 Ω.

While the invention has been described by reference to various specific embodiments, it should be understood that numerous changes may be made within the spirit and scope of the inventive concepts described. Accordingly, it is intended that the invention not be limited to the described embodiments, but will have full scope defined by the language of the following claims.

What is claimed is:

1. A method for compensating for variation in electrical resistance in a solenoid coil during pulse-width cyclic operation thereof between energized and de-energized states, comprising the steps of:
  a) providing means for determining when said coil is in said de-energized state;
  b) passing an electrical current of known amperage through said coil when said coil is in said de-energized state;
  c) measuring voltage drop across said coil during said passing of said current;
  d) calculating said electrical resistance from said amperage and said voltage drop, using Ohm's Law;
  e) selecting a nominal resistance for said coil;
  f) comparing said calculated electrical resistance to said nominal resistance to determine a resistance deviation from nominal; and
  g) adjusting said pulse width operation to change the respective lengths of said energized and de-energized states to compensate for said resistance deviation.

2. A method in accordance with claim 1 wherein said coil is disposed in a fuel injector, and wherein said adjusting step results in a change in fuel flow through said fuel injector.

3. A method in accordance with claim 1 wherein said means for determining includes an electronic circuit.

4. A method in accordance with claim 3 wherein said electronic circuit comprises a current control circuit, an enable measurement circuit, and an injector voltage measurement circuit.

5. A method in accordance with claim 4 wherein said electronic circuit further comprises a snubber circuit across said solenoid coil.

6. A method in accordance with claim 5 wherein said electronic circuit further comprises a voltage regulator.

7. An internal combustion engine, comprising:
  a) at least one fuel injector for injecting fuel into said engine, said fuel injector including an electric solenoid having a coil;
  b) pulse-width control means for controlling operation of said fuel injector by controlling the lengths of respective periods of energized and de-energized states of said coil; and
  c) electronic means for controlling said pulse-width means, comprising:

means for determining when said coil is in said de-energized state, means for passing an electrical current of known amperage through said coil when said coil is in said de-energized state, means for measuring voltage drop across said coil during said passing of said current, means for calculating said electrical resistance from said amperage and said voltage drop, using Ohm's Law, means for selecting a nominal resistance for said coil, means for comparing said calculated electrical resistance to said nominal resistance to determine a resistance deviation from nominal, and means for adjusting said pulse width operation to change said respective lengths of said energized and de-energized states to compensate for said resistance deviation to provide for correct fuel flow through said fuel injector.

* * * * *